US010972132B2

(12) United States Patent
Jang et al.

(10) Patent No.: US 10,972,132 B2
(45) Date of Patent: Apr. 6, 2021

(54) METHOD AND APPARATUS FOR RATE-MATCHING OF POLAR CODES

(71) Applicant: Samsung Electronics Co., Ltd, Suwon-si (KR)

(72) Inventors: Min Jang, Seongnam-si (KR); Seho Myung, Seoul (KR); Hongsil Jeong, Suwon-si (KR); Kyungjoong Kim, Suwon-si (KR); Jaeyoel Kim, Seongnam-si (KR); Seokki Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/934,878

(22) Filed: Mar. 23, 2018

(65) Prior Publication Data

US 2018/0278269 A1    Sep. 27, 2018

(30) Foreign Application Priority Data

Mar. 23, 2017 (KR) .......................... 10-2017-0037153

(51) Int. Cl.
*H03M 13/00* (2006.01)
*H03M 13/13* (2006.01)
(Continued)

(52) U.S. Cl.
CPC ....... *H03M 13/13* (2013.01); *H03M 13/2792* (2013.01); *H03M 13/618* (2013.01);
(Continued)

(58) Field of Classification Search
CPC ............... H03M 13/13; H03M 13/618; H03M 13/2792; H03M 13/6362; H04L 1/0041;
(Continued)

(56) References Cited

U.S. PATENT DOCUMENTS

| 6,622,281 B1 * | 9/2003 | Yun ........................ H03M 13/11 714/790 |
| 2009/0147724 A1 * | 6/2009 | Nimbalker ............ H04L 1/1819 370/315 |

(Continued)

OTHER PUBLICATIONS

France Research Center, Huawei Technologies Co. Ltd "Low-Complexity Puncturing and Shortening of Polar Codes", 6 pages, Mar. 19-22, 2017 (Year: 2017).*

(Continued)

*Primary Examiner* — Albert Decady
*Assistant Examiner* — Osman M Alshack

(57) ABSTRACT

The present disclosure relates to a communication method and system for converging a 5th-Generation (5G) communication system for supporting higher data rates beyond a 4th-Generation (4G) system with a technology for Internet of Things (IoT). The present disclosure may be applied to intelligent services based on the 5G communication technology and the IoT-related technology, such as smart home, smart building, smart city, smart car, connected car, health care, digital education, smart retail, security and safety services. In accordance with an aspect of the present disclosure a method by a transmitter using a polar coding is provided. The method includes identifying a length of interleaved transmission bits; identifying a length of a buffer corresponding to the interleaved transmission bits; determining a procedure from a first procedure and a second procedure based on at least one of the length of interleaved transmission bits and the length of buffer, if the length of the interleaved transmission bits is less than the length of the buffer; and storing the interleaved transmission bits at the buffer based on the determined procedure.

12 Claims, 9 Drawing Sheets

(51) Int. Cl.
*H04L 1/00* (2006.01)
*H03M 13/27* (2006.01)

(52) U.S. Cl.
CPC ...... *H03M 13/6362* (2013.01); *H04L 1/0041* (2013.01); *H04L 1/0069* (2013.01); *H04L 1/0071* (2013.01); *H04L 1/0057* (2013.01); *H04L 1/0065* (2013.01)

(58) Field of Classification Search
CPC ... H04L 1/0071; H04L 1/0069; H04L 1/0057; H04L 1/0065
USPC .......................... 714/752, 758, 763, 764, 776
See application file for complete search history.

(56) References Cited

U.S. PATENT DOCUMENTS

| | | | | |
|---|---|---|---|---|
| 2014/0112417 | A1* | 4/2014 | Miyazaki | H04L 1/1819 375/340 |
| 2015/0236715 | A1* | 8/2015 | Alhussien | H03M 13/6362 341/67 |
| 2016/0182187 | A1* | 6/2016 | Kim | H04L 1/1861 714/807 |
| 2016/0248547 | A1* | 8/2016 | Shen | H04L 1/0057 |
| 2016/0269050 | A1* | 9/2016 | Shen | H04L 1/0057 |
| 2016/0285479 | A1* | 9/2016 | El-Khamy | H03M 13/616 |
| 2016/0308644 | A1* | 10/2016 | Shen | H03M 13/6306 |
| 2016/0352464 | A1* | 12/2016 | Shen | H03M 13/13 |
| 2017/0181104 | A1 | 6/2017 | Jang et al. | |
| 2017/0222757 | A1* | 8/2017 | Huang | H03M 13/13 |
| 2017/0244429 | A1* | 8/2017 | Hof | H03M 13/134 |
| 2017/0264394 | A1* | 9/2017 | Shen | H03M 13/27 |

OTHER PUBLICATIONS

MediaTek Inc., "Polar Code Size and Rate-Matching Design for NR Control Channels", 3GPP TSG RAN WG1 RAN1 £88 Meeting, Feb. 13-17, 2017, 8 pages, R1-1702735.. (Year: 2017).*

International Search Report dated Jul. 2, 2018 in connection with International Patent Application No. PCT/KR2018/003388.

MediaTek Inc., "Polar Code Size and Rate-Matching Design for NR Control Channels", 3GPP TSG RAN WG1 RAN1 +88 Meeting, Feb. 13-17, 2017, 8 pages, R1-1702735.

Qualcomm Incorporated, "Design of Polar codes for control channel", 3GPP TSG-RAN WG1 NR AdHoc, Jan. 16-20, 2017, 5 pages, R1-1700832.

Intel Corporation, "Tradeoffs in Polar coding for control channels", 3GPP TSG RAN WG1 Meeting #88, Feb. 13-17, 2017, 6 pages, R1-1702713.

NEC, "Polar code design for control channel", 3GPP TSG RAN WG1 Meeting #88, Feb. 13-17, 2017, 5 pages, R1-1701884.

Huawei, et al. "Maximum mother code size of polar codes", 3GPP TSG RAN WG1 Meeting #88, Feb. 13-17, 2017, 4 pages, R1-1701703.

* cited by examiner

METHOD AND APPARATUS FOR RATE-MATCHING OF POLAR CODES

CROSS-REFERENCE TO RELATED APPLICATION(S)

This application is based on and claims priority under 35 U.S.C. § 119 to Korean Patent Application No. 10-2017-0037153 filed on Mar. 23, 2017, in the Korean Intellectual Property Office, the disclosure of which is incorporated by reference herein in its entirety.

TECHNICAL FIELD

The present disclosure relates to error-correcting codes for correcting and restoring errors and losses when there is a possibility of errors and losses due to various reasons such as noise and interference in the process of transmitting and storing data. In detail, the present disclosure relates to a method, implementation, and apparatus about rate-matching of polar codes. The present disclosure can be used in various fields, but it can be efficiently used for polar code rate-matching for mobile communication systems such as GSM, WCDMA, LTE, and 5G-NR.

BACKGROUND

To meet the demand for wireless data traffic having increased since deployment of 4G communication systems, efforts have been made to develop an improved 5G or pre-5G communication system. Therefore, the 5G or pre-5G communication system is also called a "beyond 4G network" or a "post LTE system." The 5G communication system is considered to be implemented in higher frequency (mmWave) bands, e.g., 60 GHz bands, so as to accomplish higher data rates. To decrease propagation loss of the radio waves and increase the transmission distance, the beam-forming, massive multiple-input multiple-output (MIMO), full dimensional MIMO (FD-MIMO), array antenna, an analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, Hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the internet of things (IoT) where distributed entities, such as things, exchange and process information without human intervention. The internet of everything (IoE), which is a combination of the IoT technology and the big data processing technology through connection with a cloud server, has emerged. As technology elements, such as "sensing technology," "wired/wireless communication and network infrastructure," "service interface technology," and "Security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, machine type communication (MTC), and machine-to-machine (M2M) communication may be implemented by beamforming, MIMO, and array antennas. Application of a cloud radio access network (RAN) as the above-described big data processing technology may also be considered to be as an example of convergence between the 5G technology and the IoT technology.

The necessity for more efficiently applying error-correcting codes has been increased to improve communication system with development of communication systems.

SUMMARY

An object of the present disclosure is directed to provision of rate-matching with stable performance in a polar code encoding and decoding system. In particular, an object of the present disclosure is directed to provision of improved performance even repetition of an interleaving method, which is used in the process of encoding polar codes in the related art, beyond the fact that the interleaving method was designed to improve only performance in puncturing. Another object of the present disclosure is directed to provision of an operation of determining the size of a mother code to be used in consideration of complexity, delay, and performance of a polar code encoder and decoder.

In accordance with an aspect of the present disclosure a method by a transmitter using a polar coding is provided. The method includes identifying a length of interleaved transmission bits; identifying a length of a buffer corresponding to the interleaved transmission bits; determining a procedure from a first procedure and a second procedure based on at least one of the length of interleaved transmission bits and the length of buffer, if the length of the interleaved transmission bits is less than the length of the buffer; and storing the interleaved transmission bits at the buffer based on the determined procedure.

In accordance with an aspect of the present disclosure a transmitter using a polar coding is provided. The transmitter includes a transceiver; and at least one processor coupled with the transceiver and configured to: identify a length of interleaved transmission bits, identify a length of a buffer corresponding to the interleaved transmission bits, determine a procedure from a first procedure and a second procedure based on at least one of the length of interleaved transmission bits and the length of buffer, if the length of the interleaved transmission bits is less than the length of the buffer, and store the interleaved transmission bits at the buffer based on the determined procedure.

It is possible to select a mother code of a polar code having appropriate complexity-performance and trade-off in accordance with the number of bits to be transmitted on a channel through a method of selecting a mother code of a polar code according to an embodiment. Further, it is possible to achieve high performance when the number of bits to be transmitted on a channel is not only smaller, but larger than the size of the mother code of a polar code, through the method for rate-matching of polar codes according to an embodiment. Further, the method for rate-matching of polar codes according to an embodiment makes it possible to perform a rate-matching operation with complexity that is lower than or the same as that in the related art.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
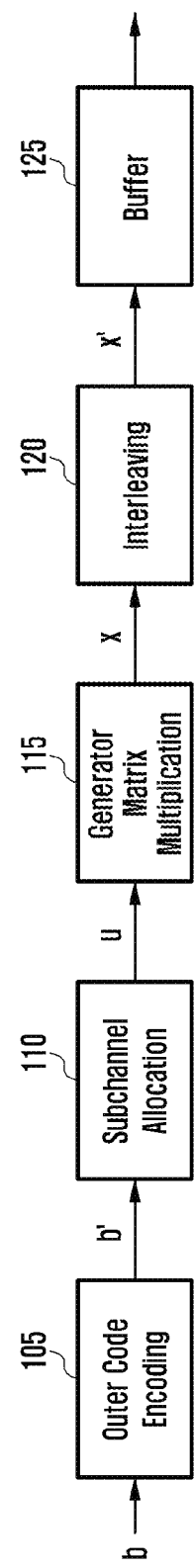
FIG. 1 illustrates a diagram illustrating a series of processes of polar code encoding and rate-matching according to an embodiment of the present disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the present disclosure will be described in detail with reference to the accompanying drawings. When it is decided that a detailed description for the known function or configuration related to the present disclosure may obscure the gist of the present disclosure, the detailed description therefor will be omitted. Further, the following terminologies are defined in consideration of the functions in the present disclosure and may be construed in different ways by the intention or practice of users and operators. Therefore, the definitions thereof should be construed based on the contents throughout the specification.

Various advantages and features of the present disclosure and methods accomplishing the same will become apparent from the following detailed description of embodiments with reference to the accompanying drawings. However, the present disclosure is not limited to the embodiments disclosed herein but will be implemented in various forms. The embodiments have made disclosure of the present disclosure complete and are provided so that those skilled in the art can easily understand the scope of the present disclosure. Therefore, the present disclosure will be defined by the scope of the appended claims. Like reference numerals throughout the description denote like elements.

Various advantages and features of the present disclosure and methods accomplishing the same will become apparent from the following detailed description of embodiments with reference to the accompanying drawings. However, the present disclosure is not limited to the embodiments disclosed herein but will be implemented in various forms. The embodiments have made disclosure of the present disclosure complete and are provided so that those skilled in the art can easily understand the scope of the present disclosure. Therefore, the present disclosure will be defined by the scope of the appended claims.

In this case, it may be understood that each block of processing flow charts and combinations of the flow charts may be performed by computer program instructions. Since these computer program instructions may be mounted in processors for a general computer, a special computer, or other programmable data processing apparatuses, these instructions executed by the processors for the computer or the other programmable data processing apparatuses create means performing functions described in block(s) of the flow charts. Since these computer program instructions may also be stored in a computer usable or computer readable memory of a computer or other programmable data processing apparatuses in order to implement the functions in a specific scheme, the computer program instructions stored in the computer usable or computer readable memory may also produce manufacturing articles including instruction means performing the functions described in block(s) of the flow charts. Since the computer program instructions may also be mounted on the computer or the other programmable data processing apparatuses, the instructions performing a series of operation steps on the computer or the other programmable data processing apparatuses to create processes executed by the computer to thereby execute the computer or the other programmable data processing apparatuses may also provide steps for performing the functions described in block(s) of the flow charts.

In addition, each block may indicate some of modules, segments, or codes including one or more executable instructions for executing a specific logical function (s). Further, it is to be noted that functions mentioned in the blocks occur regardless of a sequence in some alternative embodiments. For example, two blocks that are consecutively illustrated may be simultaneously performed in fact or be performed in a reverse sequence depending on corresponding functions sometimes.

Here, the term "-unit" used in the present embodiment means software or hardware components such as FPGA and ASIC and the "~unit" performs any roles. However, the meaning of the "~unit" is not limited to software or hardware. The "~unit" may be configured to be in a storage medium that may be addressed and may also be configured to reproduce one or more processor. Accordingly, for example, the "~unit" includes components such as software components, object oriented software components, class components, and task components and processors, functions, attributes, procedures, subroutines, segments of program code, drivers, firmware, microcode, circuit, data, database, data structures, tables, arrays, and variables. The functions provided in the components and the "~units" may be combined with a smaller number of components and the "~units" or may be further separated into additional components and "~units." In addition, the components and the "~units" may also be implemented to reproduce one or more CPUs within a device or a security multimedia card.

A polar code is the initial code that is an error-correcting code proposed by E. Arikan in 2008 and having been proved to have low encoding/complexity performance and achieve channel capacity that is a data transmission limit in all binary discrete memoryless channels. A polar code has the advantage in performance when short codes are transmitted, as compared with a turbo code and LDPC (low-density parity-check) code that are different channel capacity proximity codes. For this advantage, it is under discussion to use polar codes in 3GPP new-RAT (NR) standardization that is in progress for a 5G mobile communication, and in detail, it is considered to use polar codes in order to short control information.

A polar code is an error-correcting code defined based on a phenomenon called channel polarization under the assumption of binary discrete memoryless channel (B-DMC). Bits pass through an identical distributed (i.i.d) channel W. If the channel capacity of each channel is $0 \leq C(W) \leq 1$, it means that it is theoretically possible to transmit information as much as C(W) bits when any one bit is transmitted on the channel W, but it impossible to transmit information over C(W). When N bits are transmitted on a B-DMC channel without any operation, the channels on which the bits are transmitted each have a channel capacity of C(W), so information as much as a total of N×C(W) bits can be theoretically transmitted. The fundamental concept of channel polarization is to make the channel capacity of an effective channel, which bits of a specific rate undergoes, close to 1 and the channel capacity of an effective channel, which the other bits undergoes, close to 0 by performing channel combining and channel splitting on channels that N bits pass. In simple concept of a polar code, it is possible, after channel polarization, to transmit information bits on a channel with a high channel capacity and fix a specific value without loading information bits on a channel with a low channel capacity.

FIG. 1 illustrates a diagram illustrating a series of processes of polar code encoding and rate-matching according to an embodiment of the present disclosure.

Referring to FIG. 1, an encoding process of a polar code is generally shown.

In this encoding process, the number of information bits to be transmitted is K and the number of codeword bits to be encoded and transmitted on a channel is N.

1) Information Bit Generation

An information bit sequence $b=\{b_0, b_1, \ldots, b_{K-1}\}$ to be transmitted is generated and given.

2) Outer Code Encoding (105)

The information bit sequence b may be encoded into an outer code for performance improvement and the transmission performance can be improved through outer code encoding. As the outer code to be used, there is an error-detecting code such as a cyclic redundancy check (CRC) code or an error-correcting code such as a single parity check code. The length of parity generated by an outer code is $K_{outer}$ and the effective bit sequence of outer code coding is $b'=\{b_0', b_1', \ldots, b_{K+K_{outer}-1}'\}$. Since outer code coding is not a necessary operation, $K_{outer}=0$, b'=b when outer code coding is not considered.

3) Subchannel Allocation (110)

A bit sequence b' is mapped to a bit sequence $u=\{u_0, u_1, \ldots, u_{N_0-1}\}$ with a length $N_0$ for polar code encoding. $N_0$, which is the size of a mother polar code, is a square number of 2 and is determined by a reference configured in advance. u is an input bit sequence of polar code encoding and each bit of u may be analyzed as if each bit of u passes subchannels with different qualities by channel polarization. For this characteristic, the process of mapping b' to u is called a subchannel allocation process. A common subchannel allocation process of a polar code can be composed of three steps, but the present disclosure is not limited thereto and some of the steps may be removed or performed in combination with other steps.

3-1) The location of a subchannel on which information cannot be loaded by puncturing after encoding is determined first. Assuming that the number of bits to be punctured after encoding is $N_p$, $N_p$ bits of the bit sequence u pass an incapable subchannel or a shortened subchannel. When common method in which bits to be punctured are generated and then are not transmitted is considered, an incapable subchannel channel is generated, and when it is assuming that a transmitter fixes a bit value to be punctured at 0 and a receivers knows this fact, a shortened subchannel is generated. The locations of the Incapable/shortened subchannels are determined, depending on the locations of bits that are punctured after encoding.

3-b) Bits of the input bit sequence b' are mapped to the remaining bits of u The locations of the bits in the sequence u to which the bits of b' are mapped are determined by the channel capacity of the subchannel that the bits u of pass. That is, b' is mapped to be able to be transmitted on a subchannel having the largest channel capacity of the subchannels of u. To this end, a sequence in which the subchannel indexes of u are aligned in order of normal channel capacity is used and is called a polar code sequence. The polar code sequence may be stored in the transmitter/receiver memories or may be obtained in each transmission/reception by a specific operation.

3-c) The finally remaining bit of u is called a frozen bit. Information can be consequently transmitted by the previous operations, but the bit of u that passes a subchannel with a low channel capacity is the frozen bit. The frozen bit is determined as a value promised by a transmitter and a receiver, and is fixed at 0 when there is no specific purpose.

4) Generator Matrix Multiplication (115)

A bit sequence u with a length $N_0$ is multiplied by a generator matrix G of polar codes, thereby generating a bit sequence x with a length $N_0$. When a polar code was initially proposed by Arikan, the generation matrix G was defined as follows.

$$G = B_{N_0} F^{\otimes \log_2 N_0} \qquad \text{Equation 1}$$

where $$F = \begin{bmatrix} 1 & 0 \\ 1 & 1 \end{bmatrix}$$

and the operation of a superscript $\otimes$ n means n-time Kronecker power. For example, $$F^{\otimes 2} = \begin{bmatrix} F & 0 \\ F & F \end{bmatrix} \text{ and } F^{\otimes 3} = \begin{bmatrix} F^{\otimes 2} & 0 \\ F^{\otimes 2} & F^{\otimes 2} \end{bmatrix}.$$

$B_N$ is a $N_0 \times N_0$ bit-reversal permutation matrix. For example, $\{a_0, a_4, a_2, a_6, a_1, a_5, a_3, a_7\}$ is obtained by multiplying $\{a_0, a_1, a_2, a_3, a_4, a_5, a_6, a_7\}$ by $B_8$. Recently, in various systems, the following simple generation matrix except for $B_{N_0}$ is considered. However, a generation matrix is not limited thereto.

$$G = F^{\otimes \log_2 N_0} \qquad \text{Equation 2}$$

5) Interleaving and Rate-Matching (120)

A bit sequence x with a length $N_0$ generated by generation matrix product is interleaved for efficient rate-matching. The interleaving method is determined in advance and a bit sequence interleaved by the method is stored in a buffer with a size $N_0$ (125). A virtual circular buffer is usually assumed in mobile communication systems such as LTE and 5G-NR. Interleaved bit sequences are sequentially stored in the virtual circular buffer, and in this process, N bits are sequentially loaded and transmitted. If $N<N_0$, $N-N_0$ bits are punctured in inverse order of the order stored in the virtual circular buffer. If $N>N_0$, $N-N_0$ bits are repeated in the order stored in the virtual circular buffer. Depending on embodiments, puncturing and repetition may be adoptively performed.

In a bit-interleaved coded modulation (BICM) system including channel codes, a coding part and a rate-matching part including interleaving are designed in close connection with each other for performance improvement. However, the coding part and the rate-matching part in BICM considering a polar code are in close connection with each other, as compared with when other channel codes are considered. If the two parts are not accurately matched, a loss of performance is large such that an operation is impossible, so it is required to consider a method of encoding and rate-matching that corresponds to each other.

In this embodiment, a generation matrix defined as $G = F^{\otimes \log_2 N_0}$ is assumed in a polar code operation unless specifically stated. The description based on the generation matrix defined as $G = F^{\otimes \log_2 N_0}$ can be very easily applied under simple rules to a system defined as another form of generation matrix $G = B_N F^{\otimes \log_2 N_0}$. However, a generation matrix is not limited thereto and it is apparent that the embodiment of the present disclosure can be applied even in a case that uses a generation matrix that is applied to a system using a formation similar to a polar code.

Figure 2:
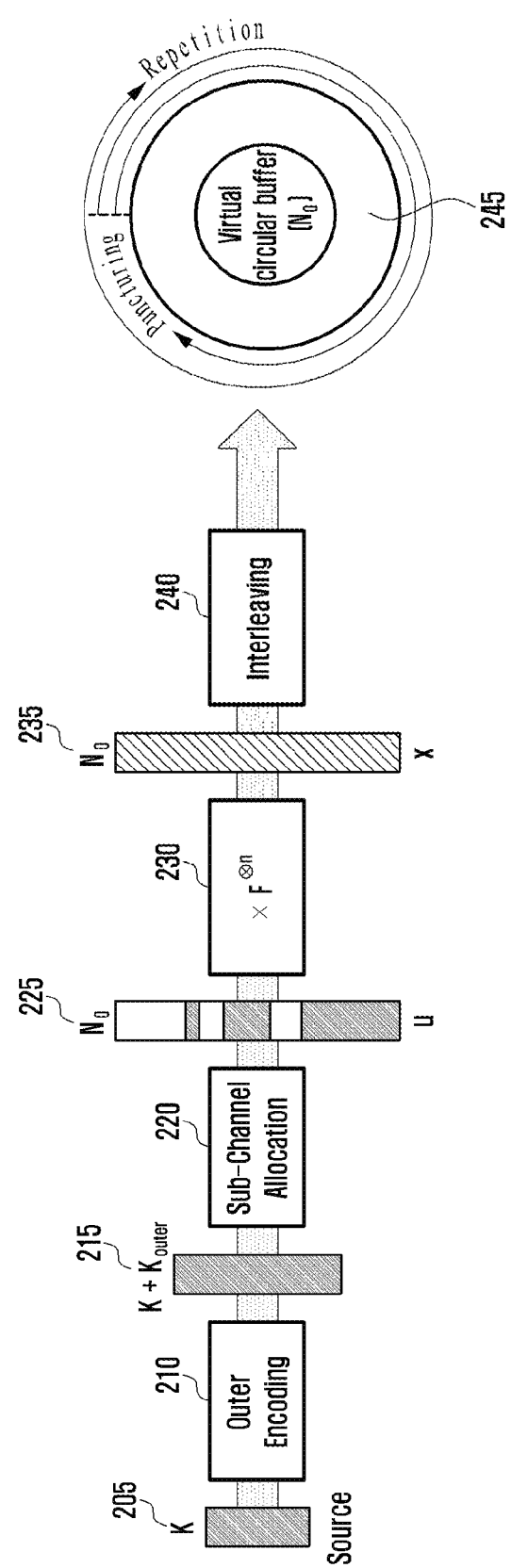
FIG. 2 illustrates a block diagram of a series of processes of polar code encoding and rate-matching for illustrating an embodiment of the present disclosure.

FIG. 2 illustrates a block diagram of a series of processes of polar code encoding and rate-matching for illustrating an embodiment of the present disclosure.

Referring to FIG. 2, in the embodiment, outer code coding 210 may be performed on a K bit source code 205. In the embodiment, a $K_{outer}$ bit outer code can be applied to outer code coding and subchannel allocation 220 may be performed on a K+$K_{outer}$ bit code as the result of outer code coding. Generation matrix product 230 may be performed on a subchannel-allocated $N_0$ bit code 225.

Interleaving 240 may be performed on a generation matrix-multiplied $N_0$ bit sequence 235. The interleaved sequence may be buffered to a virtual circular buffer 245. The buffering may be performed by the technique of repetition or puncturing in accordance with the size of the buffer and the length of the $N_0$ bit sequence.

Figure 3:
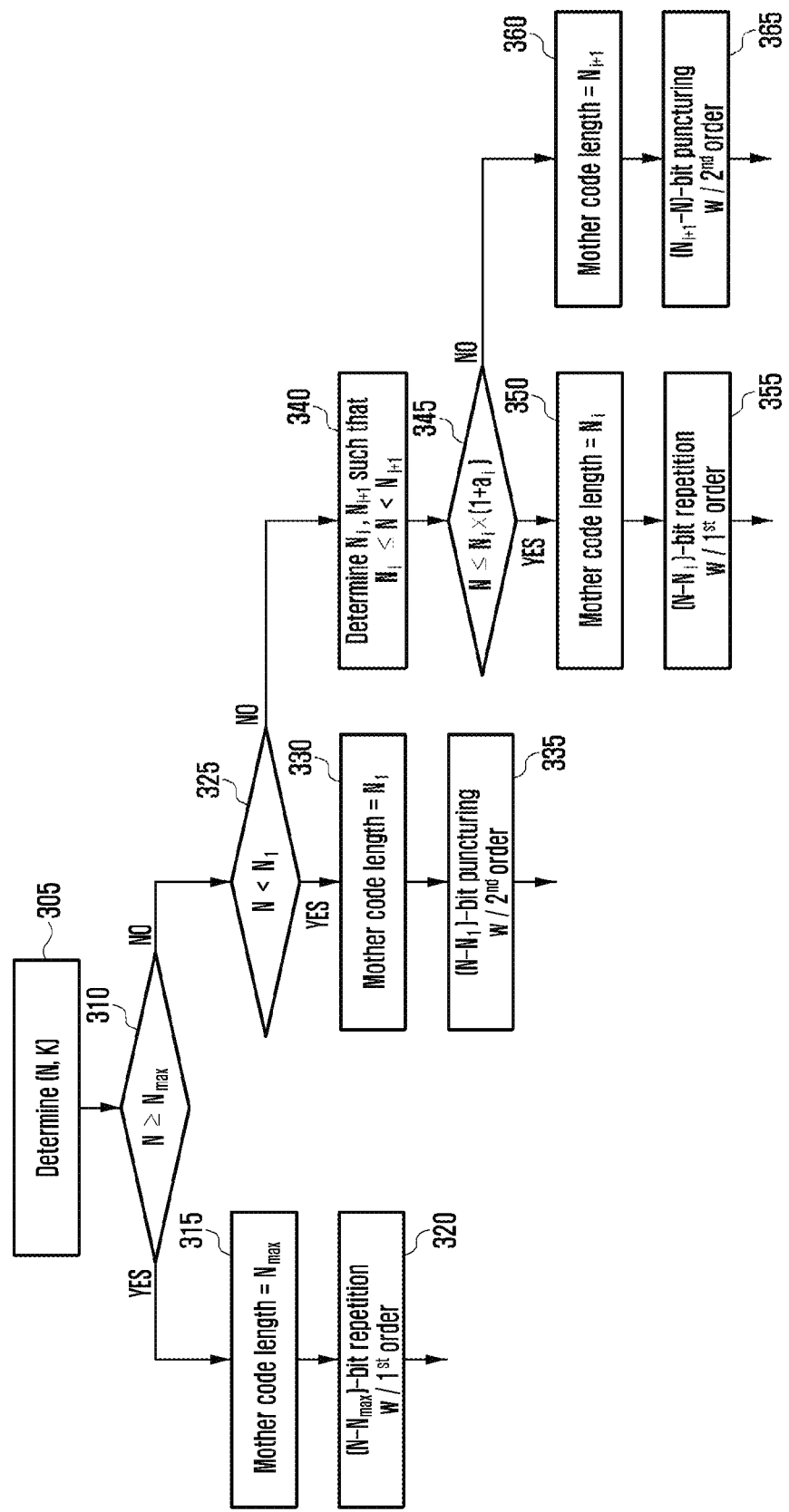
FIG. 3 illustrates a flowchart illustrating a general mother code selection, encoding, and rate-matching operation according to an embodiment of the present disclosure.

FIG. 3 illustrates a flowchart illustrating a general mother code selection, encoding, and rate-matching operation according to an embodiment of the present disclosure.

Referring to FIG. 3, an embodiment of an operation using a polar code defined as a generation matrix $G = F^{\otimes \log_2 N_0}$ is shown.

In the polar code encoding and decoding system considered in the present disclosure, the size of a supportable mother code is given as $N_1 < N_2 < \ldots < N_{max}$. All $N_i$ is square number of 2, $N_1$ is the size of the smallest polar code mother code that is supportable in the system, and $N_{max}$ is the size of the largest polar code mother code that is supportable in the system. For example, $N_1=16, N_2=32, N_3=64, N_4=128$, in which the detailed numerals may depend on embodiments.

In step 305, the number K of input bits in polar code coding input bit number and the number N of codeword bits to be transmitted on a channel are determined. The determination in the embodiment may be performed by a computing device. In the embodiment, if outer code coding of an information bit has not been performed, K is the length of the information bit. If outer code coding has been performed on the information bit, K is the length of the result that the information bit and a parity bit of outer code coding include.

In step 310, the computing device can compare N with the maximum size $N_{max}$ of a mother code that can be supported in the system.

If $N \geq N_{max}$, the computing device can determine the size of a mother code to be used in coding of a polar code $N_0 = N_{max}$ in step 315.

Accordingly, in step 320, the N−N$_{max}$ bit can be repeated in the first order in the process of transmitting the result obtained by multiplying a generation matrix G=F$^{\otimes \ log_2 N_0}$. The first order is the order of simple mapping or simple transformation and is characterized by being any one of the following four orders.

(a) The order following the generated order {x$_0$, x$_1$, x$_2$, . . . , x$_{N-1}$}

(b) The order opposite to the generated order {x$_{N-1}$, x$_{N-2}$, x$_{N-3}$, . . . , x$_0$}

(c) The order shifted by j from (a) {x$_j$, x$_{j+1}$, . . . , x$_{N-1}$, x$_0$, . . . , x$_{j-1}$}

(d) The order shifted by j from (b) {x$_{N-1-j}$, x$_{N-j-2}$, . . . , x$_0$, x$_{N-1}$, . . . , x$_{N-j}$}

Buffering can be performed through repetition in one of the orders. The first order in the embodiment may be one of the methods of (a) to (d).

If N<N$_{max}$ in the embodiment, N and the minimum size N$_1$ of a mother code that can be supported in the system can be compared in step 325.

If N<N$_1$ in the embodiment, the size of a mother code to be used for encoding of a polar code is determined as N$_0$=N$_1$ in step 330.

In step 335, the N$_1$−N bit can be punctured in a second pattern in the process of transmitting the result obtained by multiplying a generation matrix G=F$^{\otimes \ log_2 N_0}$. Puncturing means that some of N$_0$ bits generated by encoding are not transmitted. The second pattern may be determined in various types including the opposite direction to bit-reversal. Further, in the embodiment, the second pattern may be determined to correspond to the first order or regardless of the first order.

If N≥N$_1$, it is possible to determine size candidates N$_i$ and N$_{i+1}$ of a mother code that satisfy N$_i$≤N<N$_{i+1}$ in step 340. In step 345, the sizes of N and N$_i$(1+α$_i$) can be compared. α$_i$, which is a real number satisfying 0≤α$_i$<1, is determined in advance, and may be set as different values, depending on i, or may be set as the same number for all i. In the embodiment, i may be determined as different values, depending on the length of a mother code, and in detail, i may be determined such that the number of input bits and the size of a motor code correspond to a predetermined ratio. It is possible to determine whether to perform repetition and puncturing, depending on i, and it is possible to determine the size of a mother code to be applied, depending on the determination.

If N≤N$_i$(1+α$_i$) in the embodiment, the size N$_0$ of a mother code to be used for encoding of a polar code is determined as N$_i$ in step 350. In step 355, the N−N$_i$ bit is repeated in the first order in the process of transmitting the result obtained by multiplying a generation matrix G=F$^{\otimes \ log_2 N_0}$.

If N≤N$_i$(1+α$_i$), the size of a mother code to be used for encoding of a polar code is determined as N$_0$=N$_{i+1}$ in step 360. In step 365, the N$_{i+1}$−N is punctured in the second pattern in the process of transmitting the result obtained by multiplying a generation matrix G=F$^{\otimes \ log_2 N_0}$.

Figure 4:
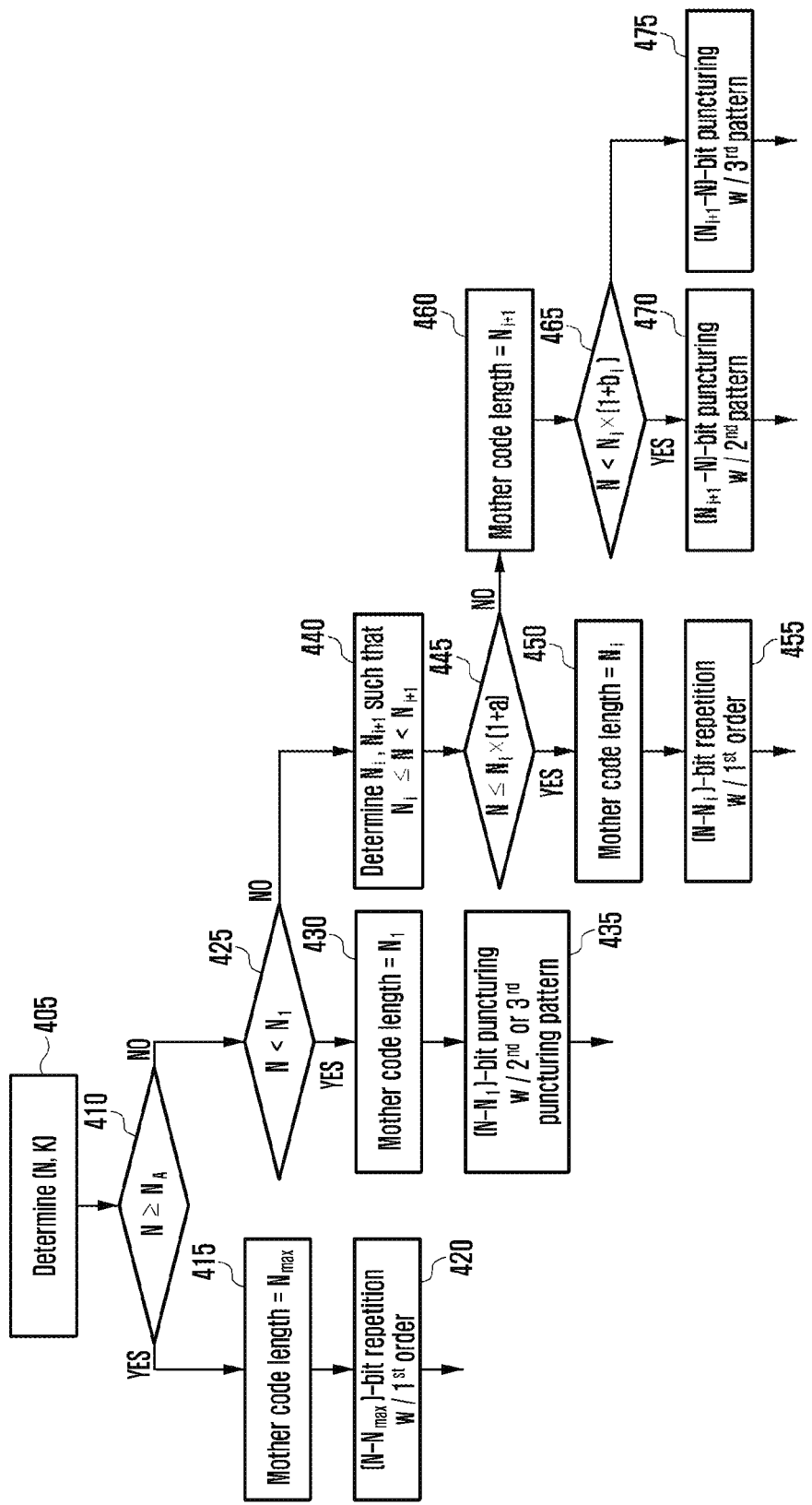
FIG. 4 illustrates a flowchart illustrating an operation considering two types of puncturing according to an embodiment of the present disclosure.

FIG. 4 illustrates a flowchart illustrating an operation considering two types of puncturing according to an embodiment of the present disclosure.

Referring to FIG. 4, a process related to an operation expanded to include two or more puncturing techniques of the present disclosure using a polar code defined as a generation matrix G=F$^{\otimes \ log_2 N_0}$ is shown.

In the embodiment, the operations of steps 405 to 430 may be performed to correspond to the operations of steps 305 to 330. In step 335 described in the previous embodiment, the second pattern was applied in puncturing, and in step 435 of this embodiment, one of a second pattern and a third pattern may be applied. According to an example, the second pattern and the third pattern may be selectively applied. The second pattern and the third pattern may be determined by at least one of the size of a mother code and the number of input bits, and may be sequentially alternately applied.

Steps 440 to 455 may be performed to correspond to the operations of steps 340 and 355.

If N>N$_i$(1+α$_i$), the size of a mother code to be used in encoding of a polar code is determined as N$_0$=N$_{i+1}$ in step 460 and N can be compared with N$_i$(1+b$_i$) in step 465. b$_i$, which is a real number satisfying 0≤b$_i$<1, is determined in advance, and may be set as different values, depending on i, or may be set as the same number for all i. If N≤N$_i$(1+b$_i$), in step 470, the N−N$_i$ bit is punctured in accordance with the second pattern. If N>N$_i$(1+b$_i$), in step 475, the N−N$_i$ bit is punctured in accordance with the third pattern. In the embodiment, the second pattern and the third pattern may be patterns determined in advance. Alternatively, the patterns may be determined in accordance with the patterns that are used in step 435.

Figure 5:
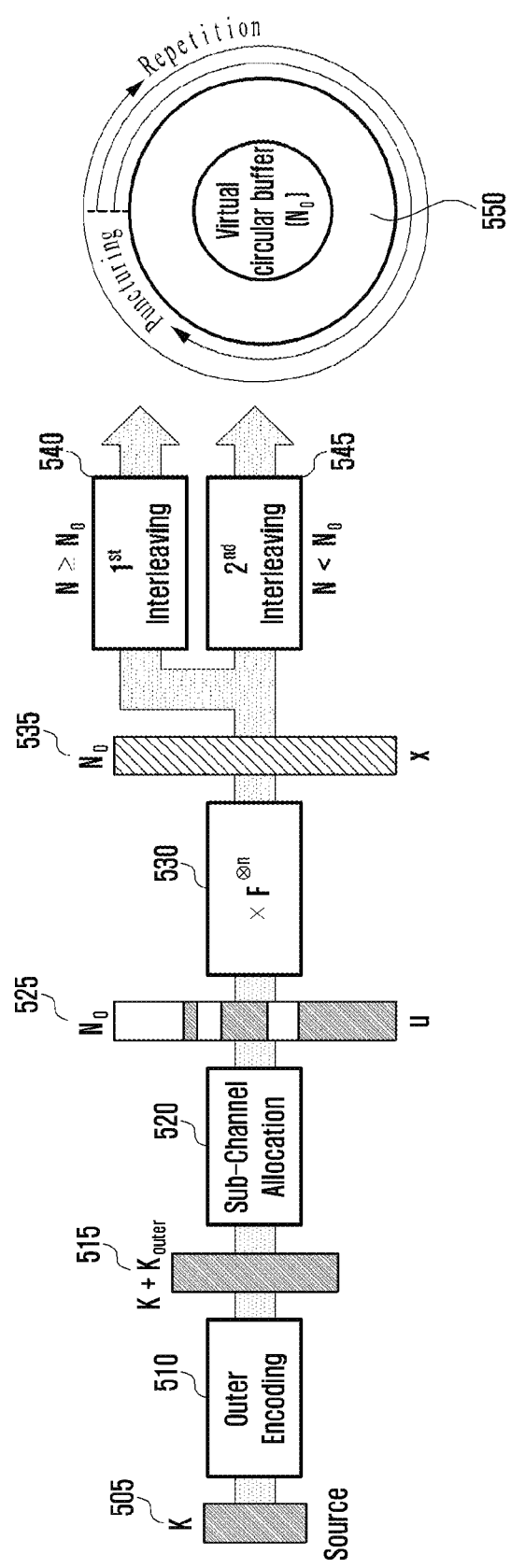
FIG. 5 illustrates a block diagram illustrating a series of processes of polar code encoding and rate-matching according to an embodiment of the present disclosure.

FIG. 5 illustrates a block diagram illustrating a series of processes of polar code encoding and rate-matching according to an embodiment of the present disclosure.

An encoding block diagram for the operation of the disclosure when a generation matrix G=F$^{\otimes \ log_2 N_0}$ is considered is shown.

The operations in steps 505 to 535 may be performed to correspond to the operations in steps 205 (e.g. K bit source code) to 235. In more detail, a series of operations for encoding, that is, outer code coding, subchannel allocation, and generation matrix product may correspond to the encoding operation of a polar code described in the previous embodiment. An effective bit sequence x 235 obtained after generation matrix product may be adoptively interleaved in accordance with the size relationship of a codeword bit N to be transmitted and the size N$_0$ of a mother code selected in accordance with the above description. If N≥N$_0$, the effective bit sequence is interleaved to be stacked on a buffer in the first order. If N<N$_0$, the effective bit sequence is interleaved in the opposite order to the second pattern to be stacked on the buffer in the second pattern. As described above, bits can be repeated or punctured in the orders described in the embodiments in accordance with N and N$_0$.

Figure 6:
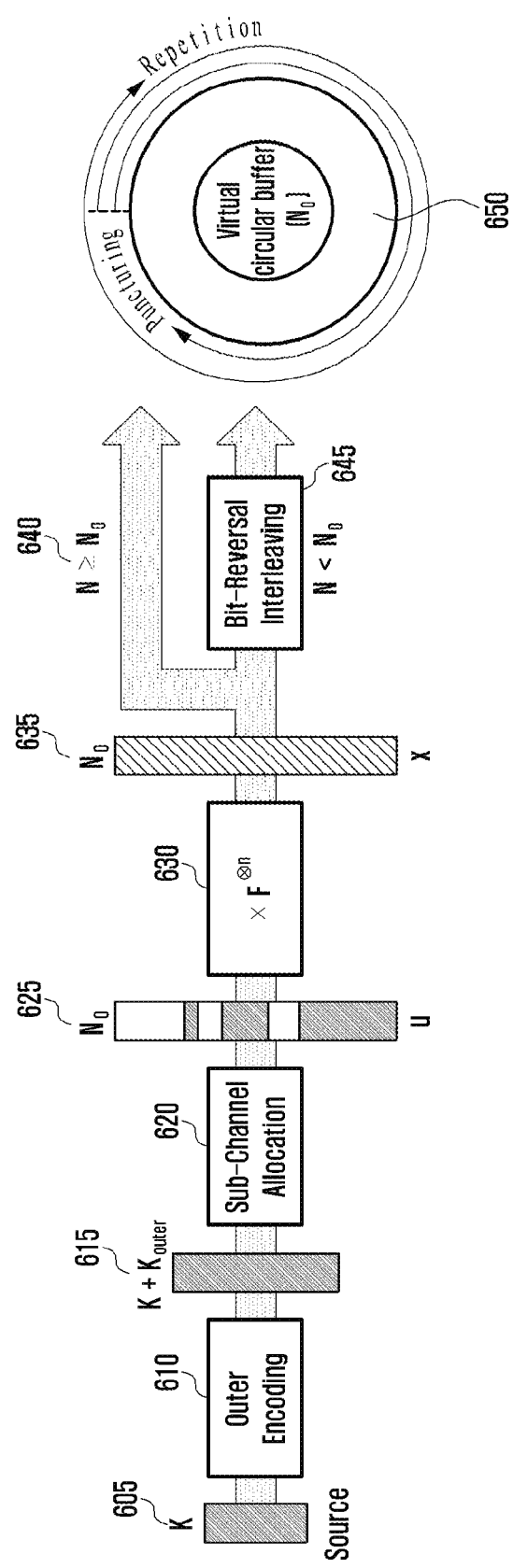
FIG. 6 illustrates a block diagram illustrating a series of processes of polar code encoding and rate-matching including an interleaver according to an embodiment of the present disclosure.

FIG. 6 illustrates a block diagram illustrating a series of processes of polar code encoding and rate-matching including an interleaver according to an embodiment of the present disclosure.

An encoding block diagram for the operation of the disclosure when a generation matrix G=F$^{\otimes \ log_2 N_0}$ is considered is shown.

The operations in steps 605 to 635 may be performed to correspond to the operations in steps 205 to 235.

In this embodiment, first interleaving that is used in puncturing is determined as bit-reversal interleaving and second interleaving that is used in repetition is determined as interleaving for performing identity mapping in steps 640 to 645. Since the second interleaving is identity mapping, the second interleaving may perform an interleaving operation. Accordingly, FIG. 6 can be achieved by adoptively applying a bit-reversal interleaver in accordance with a signal. In more detail, it is possible to determine whether to use a bit-reversal interleaver in accordance with a control signal and it is also possible to determine whether to apply different interleavers or perform identity mapping, depending on control signals.

Figure 7:
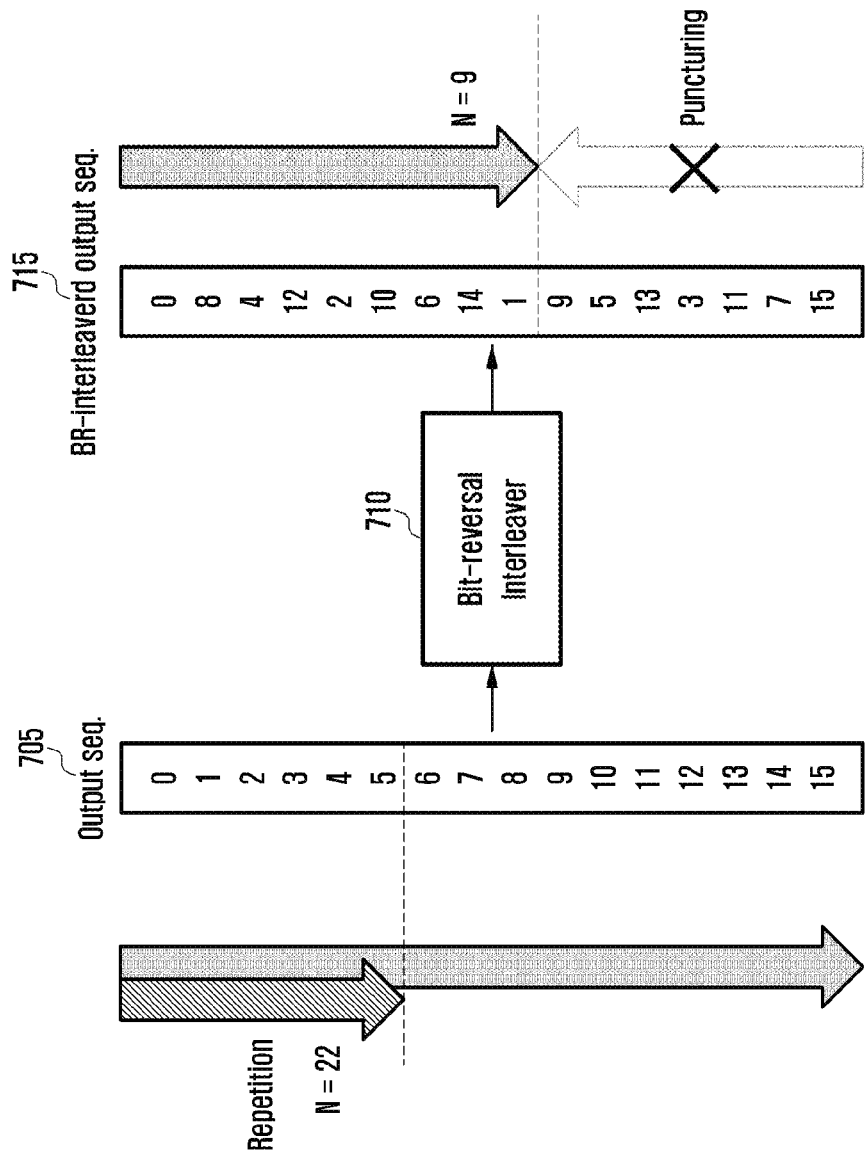
FIG. 7 illustrates a diagram illustrating a code bit selection process in repetition and puncturing according to an embodiment of the present disclosure.

FIG. 7 illustrates a diagram illustrating a code bit selection process in repetition and puncturing according to an embodiment of the present disclosure.

Referring to FIG. 7, how a bit to be transmitted in puncturing and repetition is selected by the operation of an embodiment is shown. In the example of FIG. 7, the size of a mother code is $N_0=16$, as indicated by reference numeral 705. As shown at the right side in FIG. 7, when the number of bit to be transmitted on a channel is N=9, bit-reversal interleaving 710 is performed, so nine bits from the front are selected and transmitted, as indicated by reference numeral 715, in a rearranged bit sequence. That is, seven bits from the end are punctured in the bit sequence rearranged in the bit-reversal order. As shown at the left side in FIG. 7, when the number of bits to be transmitted on a channel is N=22, sixteen bits are selected from the front in the generated order by encoding, and additionally, six bits are selected from the front. That is, six bits are repeated from the front in the generated order.

The reason of arranging an effective bit sequence in the generated order or by shifting and reversing the generated order (or combining two operations) is because repetition is operated like quasi-uniform puncturing (QUP). When repetition occurs, repeated bits undergo a relatively good channel, but non-repeated bits undergo a relatively bad channel. When there is a difference in quality of channels that effective bits undergo in terms of a mother code, as described above, it is required to maximally uniformly arrange the bits that has undergone a relative bad channel in a polar code graph in order to achieve high performance. When a generation matrix $G=F^{\otimes \log_2 N_0}$ is considered, by performing the four types of interleaving, it is possible to maximally uniformly arrange bits that have undergone a relatively bad channel in the polar code graph. By maximally uniformly arranging bits that have undergone a bad channel in a polar code graph, as in the embodiment, transmission performance can be improved.

Figure 8:
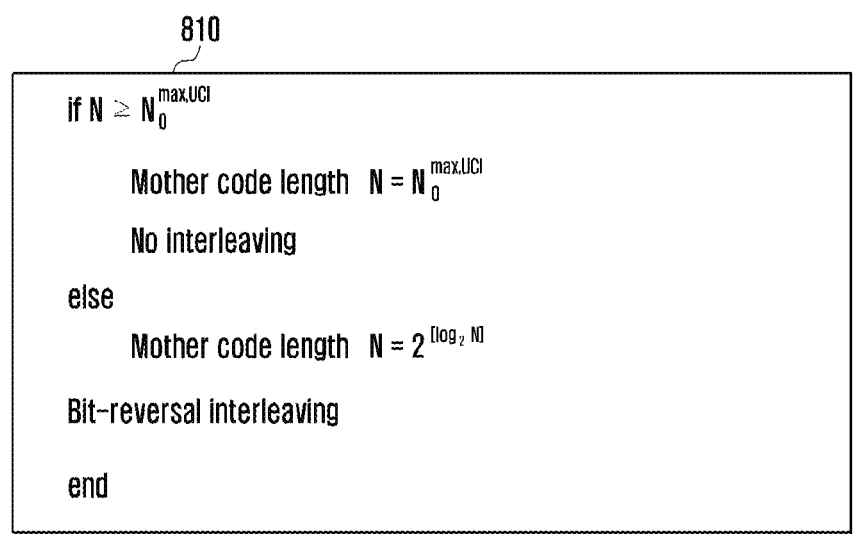
FIG. 8 illustrates a pseudo-code for performing an operation according to an embodiment of the present disclosure.

FIG. 8 illustrates a pseudo-code for performing an operation according to an embodiment of the present disclosure.

Referring to FIG. 8, a pseudo-code of an operation for performing the operations of FIGS. 6 and 7 is shown. When the size $N_0$ of a mother code is determined by the reference described above, the number N of bits to be transmitted and $N_0$ are compared. If N is larger than or equal to $N_0$, interleaving is not performed and N is stored in a circular buffer. If N is smaller than $N_0$, N is stored in the circular buffer by performing bit-reversal mapping.

Figure 9:
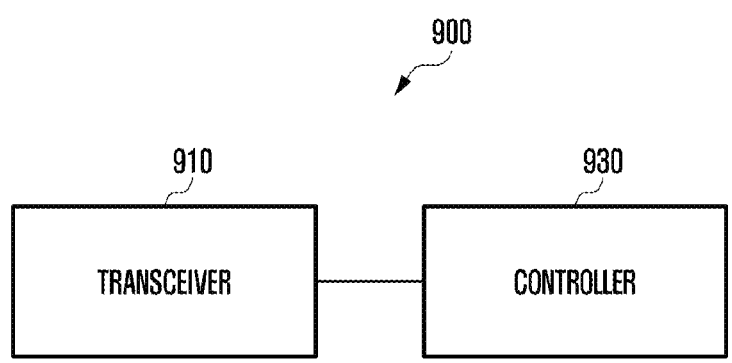
FIG. 9 illustrates a diagram illustrating an apparatus according to an embodiment of the present disclosure.

FIG. 9 illustrates a block diagram showing an electronic apparatus according to an embodiment of the present disclosure. The electronic apparatus of FIG. 9 may be a terminal or a base station. The electronic apparatus of FIG. 9 is not limited to a terminal and a base station and may include various communication apparatuses that can use a method for rate-matching of polar codes. That is, embodiments described with reference to FIGS. 1 to 8 can be applied to a communication apparatus such as a terminal and a base station that performs rate-matching of polar codes and can be performed by an electronic apparatus such as a terminal and a base station.

Referring to FIG. 9, an electronic apparatus 900 may include a transceiver 910 and a controller 930. The transceiver 910 can transmit and receive signals. The controller 930 may include at least one processor. The controller 930 can control the entire operation of the electronic apparatus. The controller 930 can control the electronic apparatus 900 to perform the operations for rate-matching of polar codes according to the embodiments described with reference to FIGS. 1 to 8.

When a terminal is the subject of transmission in embodiments, the subject of reception may be a base station or another terminal, and when a base station if the subject of transmission, a terminal, a base station, and other network entities may be the subject of reception.

A method for encoding and rate-matching in a wireless communication system using polar codes of the present disclosure to solve the problems includes: determining the size of a mother code of a polar code to be used in encoding and decoding in accordance with the number of codeword bits to be transmitted on a channel; determining a reference value for determining a rate-matching operation in accordance with the number of codeword bits to be transmitted on a channel; comparing the size of the reference value with the number of codeword bits to be transmitted on a channel; selecting one of at least two types of rate-matching operations in accordance with the comparing result; and interleaving one of the at least two types of rate-matching operations as identity mapping, reverse mapping, shifting of unit mapping, and shifting of reverse mapping.

Further, according to an embodiment, a method for encoding and rate-matching of polar codes includes: determining the size of a mother code to be used in encoding; encoding into the determined mother code; selecting one of at least two interleaving operations in accordance with the relationship between the size of a mother code and the number of bits to be transmitted in rate-matching that takes bits to be transmitted from the result of encoding into a mother code.

Although the present disclosure has been described with various embodiments, various changes and modifications may be suggested to one skilled in the art. It is intended that the present disclosure encompass such changes and modifications as fall within the scope of the appended claims.

What is claimed is:

1. A method by a transmitter using a polar code in a communication system, the method comprising:
   identifying a length of transmission bits;
   identifying a length of information bits to be encoded;
   in case that the length of the transmission bits is smaller than a minimum size of a mother code, determining a size of the mother code for a polar encoding as the minimum size of the mother code among a set of a plurality of supportable sizes of the mother code, wherein the supportable sizes of the mother code correspond to powers of 2;
   in case that the length of the transmission bits is not smaller than the minimum size of the mother code, determining a positive integer n that satisfies that $2^n$ is equal to or smaller than the length of the transmission bits and $2^{n+1}$ is larger than the length of the transmission bits, and determining the size of the mother code as $2^n$ or $2^{n+1}$ based on a comparison of $2^n \cdot (1+a)$ and the length of the transmission bits where a is a real number satisfying $0 \leq a < 1$;
   identifying a codeword by the polar encoding of the information bits based on the determined size of the mother code; and
   performing rate-matching of the codeword to obtain the transmission bits based on the length of the transmission bits.

2. The method of claim 1, wherein the performing the rate-matching of the codeword comprises:
   performing a puncturing using a first pattern or a second pattern, wherein whether the first pattern or the second pattern is used for the puncturing is determined based on the length of the information bits.

3. The method of claim 1, further comprising:
determining the size of the mother code as a largest supportable size of the mother code in case that the length of the transmission bits is equal to or larger than the largest supportable size of the mother code,
wherein the performing rate-matching of the codeword comprises:
performing a repetition of bits of the codeword.

4. The method of claim 1, wherein the performing the rate-matching of the codeword comprises:
performing a puncturing in case that the size of the mother code is $2^{n+1}$ and performing a repetition in case that the size of the mother code is $2^n$.

5. A transmitter using a polar code in a communication system,
the transmitter comprising:
a transceiver; and
at least one processor coupled with the transceiver and configured to:
identify a length of transmission bits;
identify a length of information bits to be encoded;
in case that the length of the transmission bits is smaller than a minimum size of a mother code, determine a size of the mother code for a polar encoding as the minimum size of the mother code among a set of a plurality of supportable sizes of the mother code, wherein the supportable sizes of the mother code correspond to powers of 2;
in case that the length of the transmission bits is not smaller than the minimum size of the mother code, determine a positive integer n that satisfies that $2^n$ is equal to or smaller than the length of the transmission bits and $2^{n+1}$ is larger than the length of the transmission bits, and determine the size of the mother code as $2^n$ or $2^{n+1}$ based on a comparison of $2^n \cdot (1+a)$ and the length of the transmission bits where a is a real number satisfying $0 \leq a < 1$;
identify a codeword by the polar encoding of the information bits based on the determined size of the mother code; and
perform rate-matching of the codeword to obtain the transmission bits based on the length of the transmission bits.

6. The transmitter of claim 5, wherein the at least one processor is further configured to perform a puncturing using a first pattern or a second pattern,
wherein whether the first pattern or the second pattern is used for the puncturing is determined based on the length of the information bits.

7. The transmitter of claim 5, wherein the at least one processor is further configured to determine the size of the mother code as a largest supportable size of the mother code in case that the length of the transmission bits is equal to or larger than the largest supportable size of the mother code,
wherein, to perform the rate-matching of the codeword, the at least one processor is further configured to:
perform a repetition of bits of the codeword.

8. The transmitter of claim 5, wherein the at least one processor is further configured to perform a puncturing in case that the size of the mother code is $2^{n+1}$ and perform a repetition in case that the size of the mother code is $2^n$.

9. A method by a receiver using a polar code in a communication system, the method comprising:

receiving a signal corresponding to a plurality of values from a transmitter;
identifying a length of reception bits;
in case that the length of the reception bits is smaller than a minimum size of a mother code, determining a size of the mother code for a polar decoding as the minimum size of the mother code among a set of a plurality of supportable sizes of the mother code, wherein the supportable sizes of the mother code correspond to powers of 2;
in case that the length of the reception bits is not smaller than the minimum size of the mother code, determining a positive integer n that satisfies that $2^n$ is equal to or smaller than the length of the reception bits and $2^{n+1}$ is larger than the length of the reception bits, and determining the size of the mother code as $2^n$ or $2^{n+1}$ based on a comparison of $2^n \cdot (1+a)$ and the length of the reception bits where a is a real number satisfying $0 \leq a < 1$;
performing a de-rate-matching of the plurality of values based on the length of the reception bits and the size of the mother code; and
obtaining information bits by the polar decoding based on the determined size of the mother code.

10. The method of claim 9, further comprising:
determining the size of the mother code as a largest supportable size of the mother code in case that the length of the reception bits is equal to or larger than the largest supportable size of the mother code.

11. A receiver using a polar code in a communication system, the receiver comprising:
a transceiver; and
at least one processor coupled with the transceiver and configured to:
receive a signal corresponding to a plurality of values from a transmitter;
identify a length of reception bits;
in case that the length of the reception bits is smaller than a minimum size of a mother code, determine a size of the mother code for a polar decoding as the minimum size of the mother code among a set of a plurality of supportable sizes of the mother code, wherein the supportable sizes of the mother code correspond to powers of 2;
in case that the length of the reception bits is not smaller than the minimum size of the mother code, determine a positive integer n that satisfies that $2^n$ is equal to or smaller than the length of the reception bits and $2^{n+1}$ is larger than the length of the reception bits, and determine the size of the mother code as $2^n$ or $2^{n+1}$ based on a comparison of $2^n \cdot (1+a)$ and the length of the reception bits where a is a real number satisfying $0 \leq a < 1$;
perform a de-rate-matching of the plurality of values based on the length of the reception bits and the size of the mother code; and
obtain information bits by the polar decoding based on the determined size of the mother code.

12. The receiver of claim 11, wherein the at least one processor is further configured to determine the size of the mother code as a largest supportable size of the mother code in case that the length of the reception bits is equal to or larger than the largest supportable size of the mother code.

* * * * *